United States Patent
Stöger et al.

(10) Patent No.: US 7,292,099 B2
(45) Date of Patent: Nov. 6, 2007

(54) AMPLIFIER ARRANGEMENT AND METHOD FOR OPERATION OF AN AMPLIFIER ARRANGEMENT

(75) Inventors: Claus Stöger, Linz (AT); Harald Pretl, Schwertberg (AT)

(73) Assignee: Infineon Technologies AG, Munich (DE)

( * ) Notice: Subject to any disclaimer, the term of this patent is extended or adjusted under 35 U.S.C. 154(b) by 111 days.

(21) Appl. No.: 11/137,237

(22) Filed: May 25, 2005

(65) Prior Publication Data

US 2005/0270099 A1    Dec. 8, 2005

(30) Foreign Application Priority Data

May 27, 2004    (DE) ...................... 10 2004 025 918

(51) Int. Cl.
*H03F 3/45*    (2006.01)
(52) U.S. Cl. ...................... 330/253; 330/260; 330/310; 330/311
(58) Field of Classification Search ................ 330/253, 330/260, 310, 311
See application file for complete search history.

(56) References Cited

U.S. PATENT DOCUMENTS 3,003,113 A     10/1961    MacNichol Jr.
3,003,133 A     10/1961    Herman et al.
3,660,772 A *    5/1972    Holt ............................ 330/253
4,638,260 A *    1/1987    Hamley ...................... 330/254
5,376,937 A *   12/1994    Colleran et al. ............ 341/159
5,382,916 A *    1/1995    King et al. ................. 330/253
5,703,532 A *   12/1997    Shin et al. .................. 330/253
6,911,865 B2*    6/2005    Fanous et al. .............. 330/252

OTHER PUBLICATIONS

U.S. Appl. No. 10/949,432, filed Sep. 24, 2004, Zipper et al.

\* cited by examiner

*Primary Examiner*—Patricia Nguyen
(74) *Attorney, Agent, or Firm*—Eschweiter & Associates, LLC

(57) ABSTRACT

An amplifier arrangement is provided having a first differential amplifier stage and a second differential amplifier stage, which are connected to one another with negative feedback. The second differential amplifier stage has a first voltage divider that is connected to the controlled path of the second differential amplifier stage and has at least two signal taps. The second differential amplifier stage also has a second voltage divider with at least two signal taps. Furthermore, a switching device is provided, and is connected to the at least two signal taps of the first voltage divider and to the at least two signal taps of the second voltage divider. The switching device is used to connect one of the at least two signal taps of the first voltage divider to a first output tap of the amplifier arrangement, and one of the at least two signal taps of the second voltage divider to a second output tap of the amplifier arrangement. The overall input impedance can thus be adjusted in a suitable preferred manner.

18 Claims, 2 Drawing Sheets

AMPLIFIER ARRANGEMENT AND METHOD FOR OPERATION OF AN AMPLIFIER ARRANGEMENT

REFERENCE TO RELATED APPLICATIONS

This application claims the benefit of the priority date of German application DE 10 2004 025 918.6, filed on May 27, 2004, the contents of which are herein incorporated by reference in its entirety.

FIELD OF THE INVENTION

The present invention relates to an amplifier arrangement.

BACKGROUND OF THE INVENTION

In modern communication systems, signals which have been received via an antenna are first of all amplified by a particularly low-noise amplifier (LNA) to a suitable level. However, the input level of a signal that is received via the antenna is not known. The input amplifiers are thus very frequently implemented with variable gain, in order in this way to amplify signals at different input levels to the same output level.

This is achieved, for example, via implementation of a low-noise input amplifier with a stepped gain, which is also referred to as an amplifier with a gain step. The use of an amplifier such as this simplifies the design of the downstream stages. However, one problem that has been found increasingly in this case is how to achieve a low capacitive component of the input impedance with low-noise amplifiers implemented on the basis of CMOS technology. With fixed predetermined source impedances such as those for GSM or WCDMA signals, the necessary matching to 100 to 200 Ω can be achieved only with great difficulty. Owing to the increasing demand for bandwidth and high gain on the input amplifiers, this matching problem is becoming even more serious.

Furthermore, modern mobile radio systems use an SAW filter in order to suppress adjacent channel power in the received signal. However, these filters have the characteristic that they can convert differentially suppressed signals to DC signal components. Owing to the high power in the adjacent channels, the additional signal components can lead to a reduction in the sensitivity of the downstream stages. It is thus expedient to provide a high level of Common mode rejection in addition in the input amplifier itself.

One possible way for doing this is transformation to a real input impedance by means of feedback with inductive components within the amplifier circuit. However, the formation of coils in this case in an integrated circuit, particularly when based on silicon as the semiconductor, occupies a very large area. This therefore also increases the production costs.

Another amplifier circuit which allows impedance transformation without any additional coils is shown in FIG. 3, which is known to the applicant. In this case, the traditional concept of a differential amplifier formed by the two field-effect transistors M1 and M2 is followed by a source follower formed from the two transistors M3 and M4. Input impedance transformation is achieved via the additional impedances $Z_r$, which connect the output of the amplifier circuit O and $O_x$ to the inputs In and Inx. With careful design, this amplifier circuit allows amplification with very low noise as well as suitable impedance transformation, taking into account the output resistances of the two source followers M3 and M4.

However, the source followers M3 and M4 considerably increase the power consumption. In addition, this circuit concept does not allow any additional gain and does not allow a stepped gain by means of a gain step to be provided in a simple and efficient manner, in which the loop gain and thus the input impedance as well remain constant.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to an amplifier circuit that provides high gain with an adjustable gain factor.

In one embodiment of the amplifier circuit, a first differential amplifier stage and a second amplifier stage are provided. The first and the second amplifier stages respectively contain a first and a second controlled path, as well as a first and a second output node. The second amplifier stage is in this case connected to the first differential amplifier stage via negative feedback. In consequence, the second amplifier stage is connected to the first differential amplifier stage in such a way that it forms a differential amplifier stage with negative feedback. Furthermore, the second amplifier stage contains a first and a second voltage divider, which are each connected in the differential amplifier path and are connected to one of the two controlled paths. The first and the second voltage divider in this case each have at least two signal taps. Finally, a switching device is provided, by means of which a first and a second output tap of the amplifier arrangement can be connected to one of the at least two signal taps of the first and of the second voltage divider.

With the above configuration, the negative feedback achieves the maximum possible gain and, in addition, a considerable improvement in the common mode rejection. The connection of the voltage dividers to the signal taps within the second differential amplifier stage results in the loop gain of the amplifier circuit according to the invention being kept constant. The second amplifier stage is, in one example, a differential amplifier stage.

The switching device, which connects a signal tap of the first and of the second voltage divider to the output tap of the amplifier arrangement according to the invention as a function of the respective switch position, results in a gain step which depends on the voltage ratios of the voltage divider. Suitable negative feedback allows the gain in the loop to remain constant irrespective of the switch position.

In one embodiment, the first and the second voltage divider each have at least two series-connected resistors, with one of the at least two signal taps of the first and of the second voltage divider being arranged between the at least two series-connected resistors in the first and the second voltage divider. The first of the at least two signal taps is, in one example, arranged between the voltage divider and the controlled path of the differential amplifier. The gain step which is provided by this embodiment results from the ratio of the first resistance in the voltage divider to the sum of the two resistances. In a further embodiment, the voltage divider is formed by current mirrors rather than resistors.

In another embodiment of the invention, negative feedback is provided by a connection of the control input of the first controlled path of the second amplifier stage to the output tap of the second controlled path of the first differential amplifier stage. The output tap of the first controlled path of the first differential amplifier stage is connected to the control input of the second controlled path of the second amplifier stage.

In a further embodiment, the control connection of the first controlled path is connected by a first connection of the first controlled path of the second differential amplifier stage, and the control connection of the second controlled path is connected to a first connection of the second controlled path of the second differential amplifier stage.

In still another embodiment, in order to obtain a positive influence on the overall input impedance and to improve the linearity, in each case one impedance and preferably one capacitance is connected between the connection of the first and of the second controlled path of the first differential amplifier stage and the control connection of the first and the second controlled path of the second amplifier stage.

In a further embodiment, a matching of the input impedance of the amplifier arrangement according to the invention is improved by connecting an impedance between the control connections of the first and of the second controlled path of the first differential amplifier stage and the respective first connections of the first and the second controlled path of the second amplifier stage.

The impedance is used for impedance transformation of the output impedance to the input impedance. The resultant overall input impedance is then a function of the input impedance of the first stage, the impedance between the control connections, the output impedance of the second amplifier stage and, if appropriate, the input impedance of any downstream circuit. In addition to a pure series capacitance, an additional series or parallel resistive component may also be provided. This considerably improves the real part of the overall input impedance.

In a further embodiment, the switching device is designed using field-effect transistors, for example, using field-effect transistors of a p-channel type. The first and the second controlled path in one embodiment are each formed by at least one bipolar transistor. This advantageously makes it possible to use the gradient of a bipolar transistor to save area and power in comparison to the previous coil solutions.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in detail in the following text using exemplary embodiments and with reference to the drawings, in which.

DETAILED DESCRIPTION OF THE INVENTION

Figure 1:
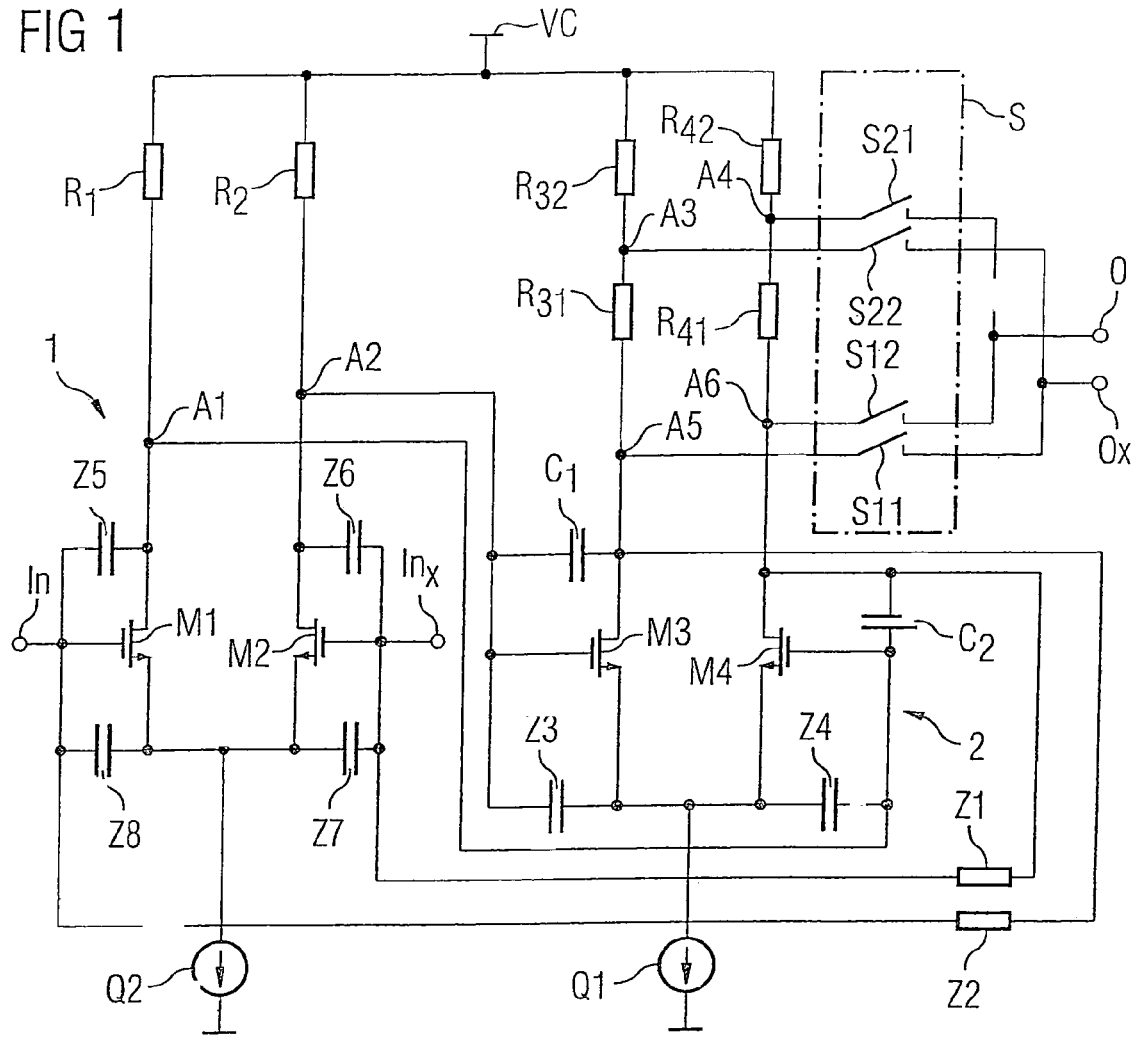
FIG. 1 is a schematic diagram illustrating a first exemplary embodiment of the invention.

One embodiment of the amplifier arrangement according to the invention as shown in FIG. 1 is in the form of an integrated circuit in a semiconductor body. Depending on the requirements, the integrated circuit is formed using silicon technology, for example bipolar complementary metal oxide semiconductor technology, which is abbreviated to Bi-CMOS or GaAs technology. However, other semiconductor systems or technologies may also be used. A number of connecting contacts are provided on the surface of the semiconductor body and are used to carry signals, but are also used to supply the integrated circuit. In addition to the amplifier arrangement according to the invention, the semiconductor body may contain additional integrated circuits for further signal processing.

The amplifier arrangement according to the invention has a first differential amplifier 1 as well as a second differential amplifier 2 with feedback. The first differential amplifier has a first controlled path M1 and a second controlled path M2, which are each formed by field-effect transistors. The source connections of the two field-effect transistors M1 and M2 are connected to a current source Q2. The drain connections are each passed via two load resistors $R_1$ and $R_2$ to the supply potential connection VC. The gain is dependent on the load resistances $R_1$ and $R_2$. It can thus be defined as the product of the transconductance gm of the transistors $M_1$ and $M_2$ and of the load resistances $R_1$ and $R_2$. The control inputs of the two field-effect transistors M1 and M2 form the signal input of the amplifier arrangement according to the invention.

The second differential amplifier stage 2 likewise contains two field-effect transistors M3 and M4, whose source connections are connected to a second current source Q1. In this exemplary embodiment, the current sources Q1 and Q2 are formed by two different, separate current sources. However, it is also possible to use a common current source. The drain connection of the transistor M3 is connected to a first resistor $R_{31}$, which is followed by a second resistor $R_{32}$. The two resistors $R_{31}$ and $R_{32}$ form a first voltage divider with the two taps A3 and A5, respectively. The drain connection of the transistor M4 is connected in the same way to the resistor $R_{41}$ and to the resistor $R_{42}$ that is connected in series with it. These two resistors also form a voltage divider with the two taps A4 and A6, respectively. Furthermore, the respective second connections of the voltage dividers or of the resistors $R_{32}$ and $R_{42}$ are connected to the supply potential connection VC.

In order to provide negative feedback for the two differential amplifier stages 1 and 2, a first output node A1 between the first transistor M1 and the first load resistance $R_1$ is connected to the control connection of the second transistor M4 in the second differential amplifier stage 2. At the same time, a second output node A2 between the second load resistance $R_2$ and the second transistor M2 in the first differential amplifier stage 1 is connected to the control connection of the field-effect transistor M3 in the second differential amplifier 2. At the same time, the control connection of the first field-effect transistor M1 in the first differential amplifier stage 1 is connected via a complex impedance $Z_2$ to the drain connection of the first transistor M3 in the second differential amplifier 2.

The drain connection of the second field-effect transistor M4 in the second differential amplifier stage 2 is coupled via a further impedance $Z_1$ to the control connection of the second field-effect transistor M2. These connections between the output nodes A1 and A2 of the first differential amplifier stage 1 and the control connections of the two field-effect transistors M3 and M4 in the second differential amplifier stage 2, as well as the drain connections of the two field-effect transistors $M_3$, $M_4$ in the second differential amplifier stage and the control connections of the field-effect transistors $M_1$, $M_2$ in the first differential amplifier stage 1 provide negative feedback for the two differential amplifiers 1 and 2. In an alternative embodiment, these connections may be provided by couplings, and may have impedances.

The two impedances Z1 and Z2 are also referred to as feedback impedances and have a positive influence on the overall input impedance of the circuit. If suitably designed, the real part of the overall input impedance is increased, and the imaginary component is reduced. In conjunction with the output impedance and the input impedance of the first stage 1, the two impedances $Z_1$ and $Z_2$ thus transform the overall input impedance. They are expediently designed to be controllable, for example by means of variable resistances and/or controllable capacitances. One example of this is varactor diodes. In this case, it is also possible to provide impedance networks composed of parallel and/or series-connected capacitances and/or resistances.

Figure 3:
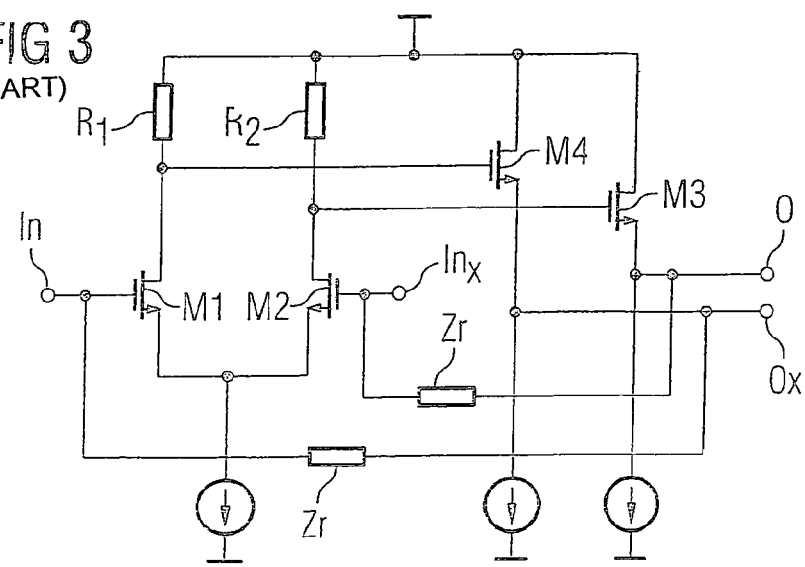
FIG. 3 is a schematic diagram illustrating a conventional amplifier arrangement.

This impedance results in the maximum possible gain for the two stages and, at the same time, in greater common mode signal rejection than in the conventional circuit shown in FIG. 3. The common mode signal component in the two output nodes A1 and A2 of the first amplifier stage 1 is used to set the operating point of the two field-effect transistors M3 and M4 in the second differential amplifier stage 2.

Furthermore, the amplifier arrangement according to the invention contains a switching device S, which contains four switches $S_{11}$, $S_{12}$, $S_{21}$ and $S_{22}$. In this case, the output tap A3 is coupled via the switch $S_{22}$ and the output tap A5 is coupled via the switch $S_{11}$ to the output tap $O_X$ of the amplifier arrangement according to the invention. The output tap O for the difference signal is connected via switches $S_{21}$ to the output tap A4, and via the switch $S_{12}$ to the output tap A6 of the second voltage divider. These switches result in a gain step in the amplification. At the same time, the loop gain within the feedback amplifier circuits is also kept constant. In consequence, the influence of the output impedance and the input impedance of the amplifier arrangement is largely independent of the switch position.

If, for example, the two switches $S_{11}$ and $S_{12}$ are closed, then, to a first approximation, the gain $V_1$, $V_2$ in the two differential amplifier paths can be described by the following equations:

$$V_1 = g_{M1} * g_{M3} * R_1 * Z_2 * (R_{31}+R_{32})/(R_{31}+R_{32}+Z_2)$$

$$V_2 = g_{M2} * g_{M4} * R_2 * Z_1 * (R_{41}+R_{42})/(R_{41}+R_{42}+Z_1)$$

In the opposite switch position, that is to say when the switches $S_{11}$ and $S_{12}$ are open, the amplification of the voltage drop, which is now reduced, is reduced to the gain $$V_1 = g_{M1} * g_{M3} * R_1 * R_{32} * Z_2/(R_{31}+R_{32}+Z_2)$$

$$V_2 = g_{M2} * g_{M4} * R_2 * R_{42} * Z_1/(R_{41}+R_{42}+Z_1)$$

Thus, depending on the switch position this results in a stepped gain setting by a factor $R_{32}/(R_{31}+R_{32})$. Since the connections for the feedback are connected between the voltage divider formed by the respective resistors $R_{31}$, $R_{32}$ and $R_{41}$, $R_{42}$ and the drain connections of the field-effect transistors $M_3$ and $M_4$, the gain within the loop remains constant irrespective of the selected switch position.

Finally, impedances with controllable capacitances in the form of capacitors $C_1$ and $C_2$ are connected between the drain connection of the transistor M3 and the control connection of the transistor M3, as well as between the drain connection of the transistor M4 and the control connection of the transistor M4. The capacitors $C_1$ and $C_2$ allow the gate/drain capacitances of the field-effect transistors M1 to M4 to be varied in order in this way to optimize the influence of the output impedance of the second amplifier stage 2 on the transformation result. Further impedances Z3, Z4 and Z7, Z8 are connected between the control connections and source connections of the field-effect transistors M3, M4 and M1, M2. Together with the two impedances Z1, Z2, the impedances Z3 and Z4 improve the linearity of the second differential amplifier stage 2, improving the transformation result, and hence the overall input impedance. The linearity of the first differential amplifier stage 1 is optimized by means of the impedances Z5 to Z8, which are likewise in the form of capacitors.

Figure 2:
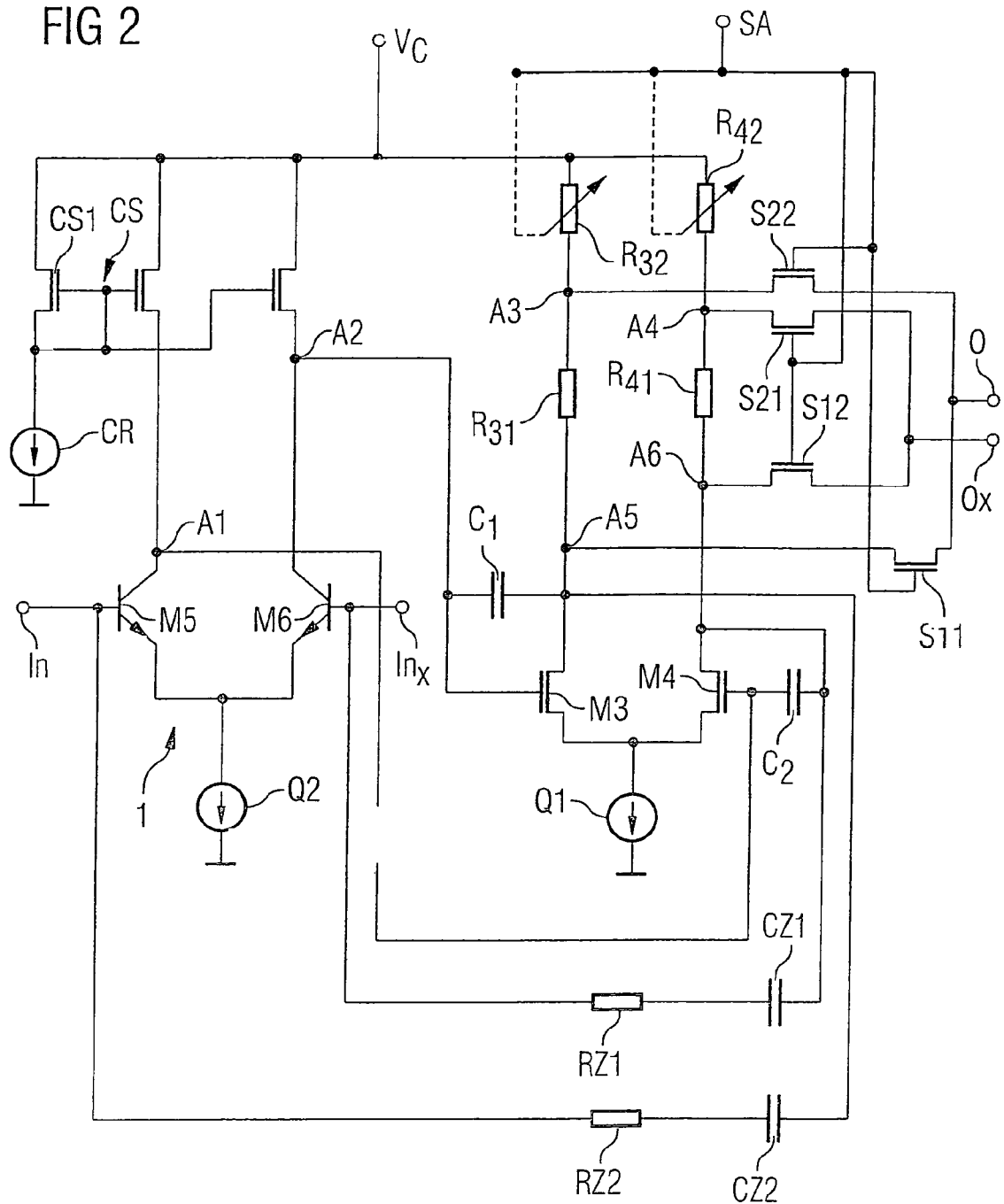
FIG. 2 is a schematic diagram illustrating a second exemplary embodiment of the invention.

FIG. 2 shows a further refinement of the invention. Components which have the same function as that in FIG. 1 are annotated with the same reference symbols. The first differential amplifier stage 1 is in this case formed by two parallel-connected bipolar transistors M5 and M6, rather than by field-effect transistors. Since a bipolar transistor has a steeper gradient than a field-effect transistor, this allows the surface area and the power consumption to be reduced. The collector connections of the two bipolar transistors M5 and M6 are each connected to a field-effect transistor in a current mirror CS.

The current mirror CS is formed together with a current mirror transistor CS1, whose control connection is connected to its source connection and to the respective control connection of, in each case, one field-effect transistor in the current mirror CS in the first differential amplifier stage 1. The current flow through the two field-effect transistors in the current mirror CS, and thus the resistance of the two field-effect transistors, is formed by a current source CR which is connected to the source connection of the current mirror transistor CS1.

Furthermore, the switches $S_{11}$, $S_{12}$, $S_{21}$ and $S_{22}$ are in the form of PMOS field-effect transistors. The control connections of the two transistors $S_{21}$ and $S_{12}$ as well as $S_{11}$ and $S_{22}$ are connected to a bus SA for supplying a control signal. The bus SA is formed by a number of signal lines. A normal control connection can also be provided, and is coupled to all of the switches. In this case, two associated switches must be connected to the connection SA via an inverter.

Since the internal resistance of the transistors when they are switched on is reflected directly in the noise factor, it is expedient to design them to have as low a resistance as possible, and thus also to have as large a surface area as possible. However, this also results in parasitic capacitances being increased. The switches thus have a slightly low-pass filter characteristic, which has a negative influence not only on the gain/bandwidth product, but also on the gain step. The field-effect transistors reduce the dominant pole, so that the absolute gain and the bandwidth are reduced. They must be appropriately dimensioned.

Furthermore, the resistors $R_{32}$ and $R_{42}$ in the first and second voltage dividers are in the form of resistances which can be adjusted by means of a control signal via the bus SA. This makes it possible to adjust the gain factor and thus the gain step of the amplifier arrangement according to the invention.

Furthermore, the respective impedances $Z_1$ and $Z_2$ are in the form of respective capacitors CZ1 and CZ2, and thus series-connected resistors RZ1 and RZ2. This series capacitance with the upstream resistance increases the real component for the matching of the input impedance of the amplifier arrangement according to the invention. However, the introduction of the resistors RZ1 and RZ2 in the negative feedback path makes the noise factor worse. As good a compromise as possible must therefore be found, in some suitable manner.

The two concepts proposed here may be combined with one another in any desired manner. Other embodiments, for example using BiCMOS or a pure bipolar technology, can also be implemented. The circuit or individual elements can also be implemented using a different conductance type to that described here. Furthermore, it is possible not only to connect the two differential amplifiers described here to one another with negative feedback, but also to provide further differential amplifier stages in order to achieve even more gain in this way.

The inclusion of the switchable load resistances in the final differential amplifier stage means that the loop gain within the arrangement is independent of the switch position. The common mode signal component in each stage is in this case used to set the operating point of the respective subsequent stage. This also results in constraints for the two load resistances R1 and R2 and for the current mirror CS (which is illustrated in FIG. 2) in the first differential amplifier stage 1.

A further embodiment is formed by AC coupling at the control inputs of the field-effect transistors M3 and M4 in the second differential amplifier stage 2. This could be done, for example, by provision of a series-connected capacitor between the two output taps A1 and A2 of the first stage and the control connections of the transistors M3 and M4. An additional, separate bias circuit is then required in order to set the operating points of the field-effect transistors M3 and M4 in the second stage 2. The amplifier arrangement may be used not only for receivers, but also for transmitters. Furthermore, the two described embodiments can be combined in any desired manner, and can also be extended, for example by further amplifier stages.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

| List of reference symbols | |
|---|---|
| 1, 2: | Differential amplifier stage |
| M1, M2, M3, M4: | Field-effect transistors |
| M5, M6: | Bipolar transistors |
| Q1, Q2: | Current sources |
| VC: | Supply potential connection |
| R1, R2: | Load resistors |
| R31, R41, R32, R42: | Voltage divider resistors |
| A1, A2: | Output nodes |
| A3, A4, A5, A6: | Signal tap |
| In, Inx: | Signal input |
| O, $O_x$: | Signal output |
| Z1, Z2: | Complex impedance |
| Z3, Z4, Z5: | Impedance |
| Z6, Z7, Z8: | Impedance |
| CS: | Current mirror |
| CS1: | Current mirror transistor |
| CR: | Current source |
| C1, C2, CZ1, CZ2: | Capacitors |
| S: | Switching device |
| S11, S12, S22, S21: | Switches |
| SA: | Bus control signal connection |
| VC: | Supply potential connection |

The invention claimed is:

1. An amplifier arrangement, comprising:
a first output tap and a second output tap forming a differential output of the amplifier arrangement;
a first differential amplifier stage comprising a first controlled path and a first output node, and comprising a second controlled path and a second output node;
a second differential amplifier stage comprising a third controlled path and a fourth controlled path, and coupled to the first and second controlled paths of the first differential amplifier stage and to the first and second output nodes of the first differential amplifier stage such that the coupling forms a negative feedback arrangement, the second differential amplifier stage further comprising a first voltage divider connected to the third controlled path and comprising at least two signal taps, and a second voltage divider connected to the fourth controlled path and comprising at least two signal taps; and
a switching device connected to the at least two signal taps of the first voltage divider and to the at least two signal taps of the second voltage divider, and configured to selectively connect one of the at least two signal taps of the first voltage divider to the first output tap, and one of the at least two signal taps of the second voltage divider to the second output tap.

2. The amplifier arrangement of claim 1, wherein a first of the at least two signal taps of the first voltage divider is arranged between the first voltage divider and the third controlled path, and a first of the at least two signal taps of the second voltage divider is arranged between the second voltage divider and the fourth controlled path.

3. The amplifier arrangement of claim 2, wherein the first voltage divider and the second voltage divider each comprise at least two series-connected resistors, with a second of the at least two signal taps of the first voltage divider and the second voltage divider are arranged between the at least two series-connected resistors, respectively.

4. The amplifier arrangement of claim 1, wherein the switching device comprises one or more field-effect transistors.

5. The amplifier arrangement of claim 1, wherein the first controlled path and the second controlled path of the first differential amplifier stage each have a control connection that collectively form a differential signal input of the amplifier arrangement, and wherein a respective first connection of the first controlled path and the second controlled path is coupled to a supply potential.

6. The amplifier arrangement of claim 5, wherein the first connections of the first and second controlled paths are connected via a current mirror to the supply potential.

7. The amplifier arrangement of claim 1, wherein the first output node of the first differential amplifier stage is connected to a control connection of the fourth controlled path and, via a first charge store, to a first connection of the fourth controlled path, and wherein the second output node of the first differential amplifier stage is connected to a control connection of the third controlled path and, via a second charge store, to a first connection of the third controlled path.

8. The amplifier arrangement of claim 7, wherein a control connection of the first controlled path is coupled to the first connection of the third controlled path, and a control connection of the second controlled path is connected to the first connection of the fourth controlled path.

9. The amplifier arrangement of claim 1, wherein the first and the second controlled paths each comprise at least one field-effect transistor.

10. The amplifier arrangement of claim 1, wherein the first and the second controlled paths each comprise at least one bipolar transistor.

11. The amplifier arrangement of claim 1, further comprising means for transforming a real part and an imaginary part of the overall input impedance of the amplifier arrangement provided between the first differential amplifier stage and the second differential amplifier stage.

12. An amplifier arrangement, comprising:
a first output tap and a second output tap forming a differential output of the amplifier arrangement;
a first differential amplifier stage comprising a first controlled path and a first output node, and comprising a second controlled path and a second output node;
a second differential amplifier stage comprising a third controlled path and a first voltage divider connected to the third controlled path, the first voltage divider comprising at least two signal taps, the second differential amplifier stage further comprising a fourth controlled path and a second voltage divider connected to the fourth controlled path, the second voltage divider comprising at least two signal taps,
wherein the first output node of the first differential amplifier stage is coupled to a control connection of the fourth controlled path,
wherein the second output node of the first differential amplifier stage is coupled to a control connection of the third controlled path,
wherein one of the at least two signal taps of the first voltage divider is arranged between the third controlled path and the first voltage divider, and is coupled to a control connection of the first controlled path, and
wherein one of the at least two signal taps of the second voltage divider is arranged between the fourth controlled path and the second voltage divider, and is coupled to a control connection of the second controlled path.

13. The amplifier arrangement of claim 12, further comprising a switching device connected to the at least two signal taps of the first voltage divider and to the at least two signal taps of the second voltage divider, and configured to selectively connect one of the at least two signal taps of the first voltage divider to the first output tap, and one of the at least two signal taps of the second voltage divider to the second output tap.

14. The amplifier arrangement of claim 12, wherein the first voltage divider and the second voltage divider each comprise at least two series-connected resistors, wherein a second of the at least two signal taps of the first and of the second voltage dividers are arranged between the at least two series-connected resistors in the first and the second voltage dividers, respectively.

15. The amplifier arrangement of claim 12, wherein the first controlled path and the second controlled path of the first differential amplifier stage each comprise a control connection that collectively form a differential signal input of the amplifier arrangement, and a respective first connection of the first and of the second controlled path is coupled to a supply potential.

16. An amplifier arrangement, comprising:
a first output tap and a second output tap forming a differential output of the amplifier arrangement;
a first differential amplifier stage comprising a first controlled path and a first output node, and comprising a second controlled path and a second output node;
a second differential amplifier stage comprising a third controlled path and a fourth controlled path, which are coupled to respective ones of the first and second controlled paths of the first differential amplifier stage and to the first and second output nodes of the first differential amplifier stage such that the second differential amplifier stage provides a negative feedback to the first differential amplifier stage,
the second differential amplifier stage further comprising a first voltage divider connected to the third controlled path and comprising at least two signal taps, and comprising a second voltage divider connected to the fourth controlled path and comprising at least two signal taps;
a first field-effect transistor configured to selectively couple a first of the at least two signal taps of the first voltage divider that is connected between the third controlled path and the first voltage divider to the first output tap;
at least one second field-effect transistor configured to selectively couple a second of the at least two signal taps of the first voltage divider that is connected between at least two series-connected resistors in the first voltage divider to the first output tap;
a third field-effect transistor configured to selectively couple a first of the at least two signals taps of the second voltage divider that is connected between the fourth controlled path and the second voltage divider to the second output tap; and
at least one fourth field-effect transistor configured to selectively couple a second of the at least two signal taps of the second voltage divider that is connected between at least two series-connected resistors in the second voltage divider to the second output tap, wherein either the first or second field-effect transistor are switched on at a given time, and either the third or fourth field-effect transistor are switched on at the given time.

17. The amplifier arrangement of claim 16, wherein the second field-effect transistor comprises a complementary field-effect transistor to the first field-effect transistor, and the fourth field-effect transistor comprises a complementary field-effect transistor to the third field-effect transistor, and the first and the second field-effect transistors are connected at their respective control connections to a signal line of a bus, and the third and the fourth field-effect transistor are connected at their respective control connections to a further signal line of the bus.

18. The amplifier arrangement of claim 16, wherein the first or the second, and the third or the fourth field-effect transistors comprise PMOS field-effect transistors.

* * * * *